(12) United States Patent
Baets et al.

(10) Patent No.: US 6,191,890 B1
(45) Date of Patent: *Feb. 20, 2001

(54) OPTICAL SYSTEM WITH A DIELECTRIC SUBWAVELENGTH STRUCTURE HAVING HIGH REFLECTIVITY AND POLARIZATION SELECTIVITY

(75) Inventors: Roel Baets, Deinze; Bart Demeulenaere, Gent; Bart Dhoedt, Sint-Kruis Brugge; Stefan Goeman, Hasselt, all of (BE)

(73) Assignees: Interuniversitair Micro-Elektronica Centrum vzw, Leuven (BE); University of Gent, Gent (BE)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/829,348

(22) Filed: Mar. 31, 1997

Related U.S. Application Data
(60) Provisional application No. 60/016,454, filed on Apr. 29, 1996.

(30) Foreign Application Priority Data

Mar. 29, 1996 (BE) .................................................. 09600280

(51) Int. Cl.$^7$ ...................................................... G02B 5/18
(52) U.S. Cl. ......................... 359/572; 359/569; 359/566; 359/576
(58) Field of Search .................................. 359/566, 569, 359/572, 558, 576

(56) References Cited

U.S. PATENT DOCUMENTS

| | | | |
|---|---|---|---|
| 5,155,622 | * 10/1992 | Kawatsuki et al. | 359/566 |
| 5,255,278 | 10/1993 | Yamanaka | 372/45 |
| 5,598,300 | * 1/1997 | Magnusson et al. | 359/566 |
| 5,694,247 | * 12/1997 | Ophey et al. | 359/566 |
| 5,726,805 | * 3/1998 | Kaushik et al. | 359/568 |

FOREIGN PATENT DOCUMENTS

| | | | |
|---|---|---|---|
| 58-174906 | * 10/1983 | (JP) | 359/569 |
| 2-178604 | * 7/1990 | (JP) | 359/569 |

OTHER PUBLICATIONS

T. Gaylord, et al., "Zero–reflectivity high spatial–frequency rectangular –grove dielectric surface–relief gratings", Applied Optics, vol. 25, pp. 4562–4567, Dec. 1986.*

D.C. Flanders, et al., "Surface relief structures with linewidths below 2000 Å", Appl. Phys. Lett., vol. 32, No. 2, pp. 112–114, Jan. 1978.*

J–L Roumiguieres, "The rectangular–groove Grating used as an Infra–Red Polarized", OPTICS COMM., vol. 19, No. 1, pp. 76–78, Oct. 1976.*

Chou et al., "Subwavelength Amorphous Silicon Transmission Gratings and Applications and Waveplates", Appl. Phys. Lett., 67 (6), pp. 742–744, Aug. 7, 1995.

Bertoni et al., "Frequency–Selective Reflection and Transmission by a Periodic Dielectric Layer," IEEE Transactions on Antennas and Propagation, vol. 37, No. 1, pp. 78–83, Jan. 1989.

(List continued on next page.)

*Primary Examiner*—Cassandra Spyrou
*Assistant Examiner*—John Juba, Jr.
(74) *Attorney, Agent, or Firm*—McDonnell Boehnen Hubert & Berghoff (57) ABSTRACT

The present invention is related to a system for transferring a beam of electromagnetic radiation having a vacuum wavelength. The system according to the invention includes a first dielectric medium, a second dielectric medium and a dielectric layer in between the first and the second medium. The dielectric layer has a periodicity of the dielectric properties parallel to the layer. The periodicity has a period that is smaller than the wavelength of the electromagnetic radiation in the second dielectric medium.

49 Claims, 4 Drawing Sheets

OTHER PUBLICATIONS

S. S. Wang, et al., "Multipayer Waveguide–grating Filters", APPLIED OPTICS, vol. 34, No. 14, pp. 2414–2420, May 1995.*

S. Hava and M. Auslender; "Silicon gating–based mirror for 1.3–Mm polarized beams: MATLAB–aided design"; Appled Optics, Feb. 20, 1995.

Turunen et al., "Bragg holograms wth baniry synthetic surfce–relief profile"; Optics Letters; Jun. 15, 1993, vol. 18, No. 12, pp. 1022–1024.

R. Magnusson and S.S. Wang; "New principle for optical filters"; Applied Physics Letters; Aug. 31, 1992, vol. 61, No. 9; pp. 1022–1024.

Barkeshli S. et al, "On the Analysis and Design of the Requency Selective Surface for the N–Star Satellite KU/S–Shaped Reflector"; vol. 3, Jun. 18, 1995, IEEE Antennas –and Propagation Society International Symposium Digest pp. 1656–1658.

Costa J C W A et al., "Analysis of the Selective Behavior of Multilayer Structures with a Dielectric Grating" IEEE Transactions on Antennas and Propagation, vol. 43, No. 5, May 1995, pp. 529–533.

Grann et al., "Artificial uniaxial and biaxial dielectrics with use of two–dimensional subwavelength binary gratings"; Journal of Optical Society of America, vol. 11, No. 10, Oct. 1994 pp. 2695–2703.

S.S. Wang and R. Magnusson, "Theory and Applications of Guided–Mode Resonance Filters", Applied Optics, vol. 32. No. 14, pp. 2606–2613, May 1993.*

S.S. Wang and R Magnusson, "Multilayer Waveguide–Grating Filters", Applied Optics, vol. 34, No. 14, pp. 2414–2420, May. 1995.*

R. Magnusson and S.S. Wang, "New Principle for Optical Filters", Applied Physics Letters, 61 (9), pp. 1022–1024, Aug. 1992.*

L. Mashev and E. Popov, "Diffraction Efficiency Anomalies of Multicoated Dielectric Gratings", Optics Comm., vol. 51, No. 3, pp. 131–136, Sep. 1984.*

* cited by examiner

OPTICAL SYSTEM WITH A DIELECTRIC SUBWAVELENGTH STRUCTURE HAVING HIGH REFLECTIVITY AND POLARIZATION SELECTIVITY

REFERENCE TO RELATED APPLICATION

This application claims priority benefits under 35 U.S.C. § 119 based upon Belgian Patent Application No 09600280, filed Mar. 29, 1996, and U.S. provisional application Ser. No. 60/016,454, filed on Apr. 29, 1996.

FIELD OF THE INVENTION

The present invention relates to a system for transferring a beam of electromagnetic radiation having a vacuum wavelength, said system comprising a first dielectric medium and a second dielectric medium with respective refractive indices.

BACKGROUND OF THE INVENTION

In Stephen Y. Chou and Wenyong Deng, "Subwavelength Amorphous silicon transmission gratings and applications in polarizers and waveplates", Appl. Phys. Lett., 67 (6), pp.742–744, Aug. 7, 1995 there is described a fabrication and an experimental evaluation of subwavelength gratings consisting of a patterned layer amorphous silicon on a planar silica substrate. Measurements on this structure show (for normal incidence) a very different behaviour between TE and TM operation, and for one particular parameter set, transmission for the TM-mode is very low. Detailed calculations on this structure, according to the "Rigourous Coupled Wave Analysis" method show that for this particular configuration the specular TM reflection is as high as 91.6%.

It is to be noted that the period of the gratings is smaller than the wavelength in the substrate and superstrate and that this structure is to be illuminated from the low refractive index side.

In Henry L. Bertoni, Li-Hsiang S. Cheo, and Theodor Tamir, "Frequency-Selective Reflection and Transmission by a Periodic Dielectric Layer", IEEE Transactions on Antennas and Propagation, Vol. 37, no.1, pp. 78–86, January 1989, there is described a dielectric structure exhibiting a complex behaviour in terms of reflection/transmission characteristics as a function of frequency, offering close to 100% reflection for properly chosen parameters.

The principle of operation relies on exciting a guided mode in a grating layer, propagating along the direction parallel to the layer direction. This waveguide mode is actually a leaky mode, due to the periodic nature of the waveguide. For properly chosen parameters, this excited mode couples for nearly 100% to zero order in reflection or transmission.

This implies that only structures with a high refractive index grating layer between a relatively low index substrate and superstrate are suitable. Furthermore this principle only works for oblique incidence.

U.S. Pat. No. 5,255,278 relates to semiconductor laser comprising a mirror having a dielectric layer with a grating structure etched in the dielectric layer whereon the metal layer is deposited. A high reflectivity is obtained by using the covering metal layer. This mirror is appropriate only for substrate-side emitting lasers.

SUMMARY OF THE INVENTION

The above cited systems are thus known. The present invention relates to a system for transferring a beam of electromagnetic radiation having a vacuum wavelength, said system comprising a first dielectric medium with a first refractive index wherein said beam can propagate, a second dielectric medium with a second refractive index and a dielectric layer in between said first medium and said second medium. The present invention aims at obtaining a very high reflectivity to the zero order reflective plane waves and a very low coupling to the zero order transmissive plane wave and also to the higher order reflective plane waves. To solve this problem, there is proposed according to the invention a system which is remarkable in that said dielectric layer has a periodicity of the dielectric properties parallel to said layer, said periodicity having a period that is smaller than the wavelength of the electromagnetic radiation in said second dielectric medium, said dielectric properties and said periodicity of said dielectric layer further being chosen such that their parameter cooperatively establish that said beam when incident on said dielectric layer is reflected for substantially 100% into the specular zero-order reflection, wherein the latter stands for more than 90%.

According to an embodiment of the invention, said dielectric layer has a sufficiently large variation of said dielectric properties within one repetition of said period such that said beam when incident on said dielectric layer excites at least two propagating modes within said layer, wherein further said beam preferably is substantially orthogonally incident on said dielectric layer.

According to a further embodiment of the invention, said dielectric layer has a periodicity of the dielectric properties in a plurality of directions, said periodicity having a period for each of said directions that is smaller than the wavelength of the electromagnetic radiation in said second dielectric medium.

According to a specific embodiment of the present invention said dielectric layer is a grating. Said grating can be a grated surface structure of the second dielectric medium, said dielectric layer being composed of the same material as said second medium.

According to a more particular embodiment, the present invention relates to an optical system comprising a highly reflective grating to order zero or a so-called Giant Reflectivity to order 0 (GIRO)-grating which is a periodically corrugated interface between a dielectric medium 1 with refractive index $n_1$ and another dielectric medium 2 with refractive index $n_2$ ($<n_1$).

Upon incidence of a plane wave of a particular wavelength, polarization and angle of incidence from medium 1 exhibits a close to 100% reflectivity to the zero order reflective plane wave and close to 0% coupling to the zero order transmissive plane wave and to the higher order reflective plane waves, whereby the zero order reflectivity is much larger than the reflectivity of the equivalent plane interface between medium 1 and medium 2. This will only happen for particular combinations of refractive indices $n_1$ and $n_2$, angle of incidence, polarization, wavelength and grating parameters such as pitch or pitches, depth and shape. One necessary condition is that the pitch $\Lambda$ is at least smaller than the wavelength $\lambda/n_2$ in medium 2 (with $\lambda$ being the vacuum wavelength) so that only zero order transmissive orders can exist. Another necessary condition is that the difference between $n_1$ and $n_2$ is sufficiently large such that within the grating region at least 2 propagative modes are excited by the incident plane wave.

Furthermore, in the case of a one-dimensionally periodic grating, the device has been found to work better for TM-polarization compared to TE-polarization. The grating parameters for optimal TM or TE-operation are different, thereby allowing said device to realize a large polarization selectivity for the zero order reflectivity, even for normal incidence.

An advantageous embodiment of the present invention thus comprises said grating having a one dimensional periodicity (Λ), wherein particularly a TM-polarization mode is set and/or wherein a TE-polarization mode is set, whereby the grating parameters are different for optimal TM- or TE-mode.

According to a specific embodiment of the invention, said grating has a substantially rectangular cross section. More particularly, said grating has a so-called filling factor which is comprised between 40 and 60%, preferably approximately 50%. More particularly still the second medium referred to the propagating direction of said beam, is formed by air or vacuum with a second refractive index $n_2$ being approximate to unity.

Herewith, according to a particularly advantageous embodiment of the invention, the grating parameters are chosen so as to be comprised within a minimum zero order transmission and maximum zero order reflection or a trade off between those two wherein said expressions are presented hereafter.

According to another particularly advantageous embodiment of the invention, the above mentioned giant reflective zero order grating is used as a mirror in a vertical cavity surface emitting laser (VCSEL), thereby replacing the more traditional Bragg quarter-wavelength stack, offering major advantages for the performance and fabrication simplicity of such devices.

Facing to the problem of dielectric mirrors with high reflectivity, there is provided a one dimensional grating, with a specific geometry preferably substantially rectangular, without introducing additional materials, thus reducing the problems of differential thermal expansion and mechanical stability, and with a highly polarization selective reflectivity.

Specifically there is provided here according to the latter embodiment a grating with linear grooves from a homogeneous medium with reflective index $n_1$ and wherein the selection of the grating period is such that coupling to higher orders in transmission is suppressed, wherein further the grating thickness is selected such that the two present propagating modes are in anti-phase after propagation through the grating, the backpropagating field interfering constructively with the primary reflection at interface 1, and the total reflected field exhibiting a constant phase.

Further aspects and particularities are defined in the other sub-claims annexed hereto. Further advantages will appear from the exemplary embodiments described hereinafter which are illustrated with the appended drawings, wherein,

DETAILED DESCRIPTION

Preferred Embodiment 1

Figure 1:
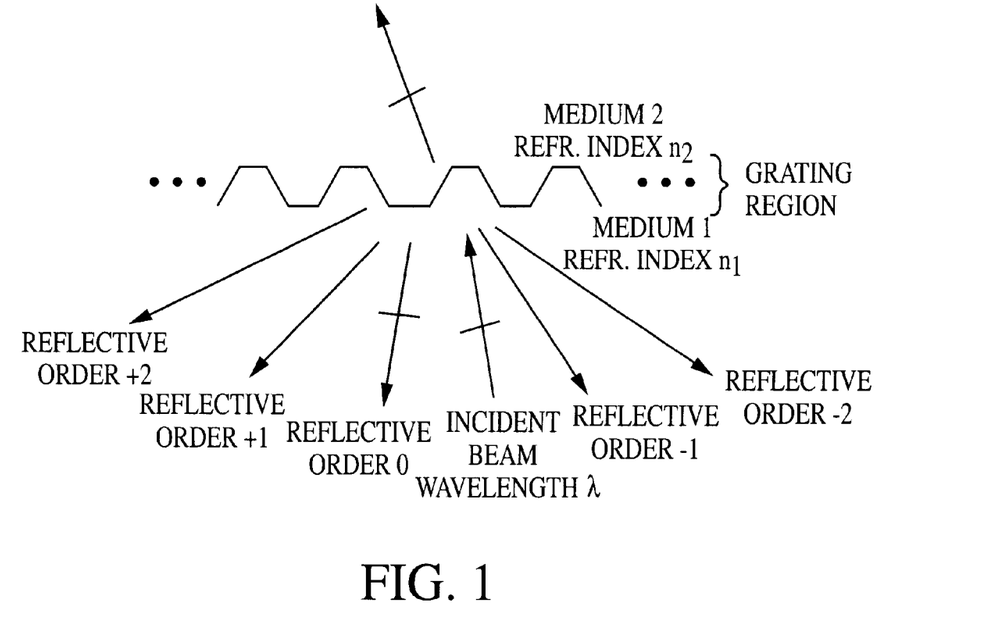
FIG. 1 is a cross sectional view of a first embodiment of a grating structure according to the invention.
Figure 2:
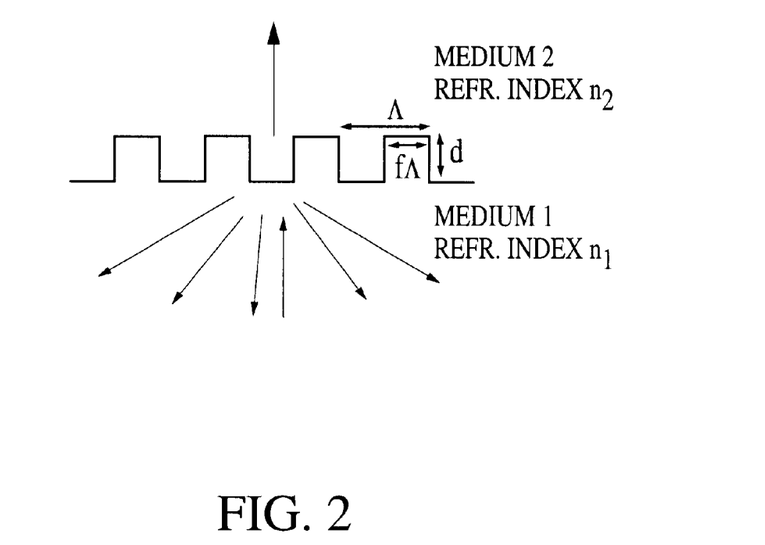
FIG. 2 shows a view of a second embodiment of a grating structure according to the invention, similar to FIG. 1.

The physical mechanism behind grating structures, hereafter called GIRO-grating, standing for GIANT Reflectivity to order O is set out on the basis of a more specific case described hereafter: $n_2=1$ (air or vacuum). Normal incidence and a grating with a rectangular shape and a grating filling factor f=50% (FIG. 2).

The highly reflective configuration described above can be designed for TE-polarization incidence (i.e. incident electric field vector parallel with the grating fringes) as well as for TM-polarization incidence (i.e. incident magnetic field vector parallel with the grating fringes). The design parameters for structures offering high reflectivity for TE-polarization will however differ from structures optimized for high reflectivity for TM-polarization. Therefore, structures optimized for high reflectivity for one polarization can show relatively low reflectivity for the other polarization, thereby offering high polarization selectivity. The approximation made for arriving at the design rules described above are better for TM-polarization incidence, and consequently designs based on these design rules offer high reflectivity for the TM-polarization rather than for the TE-polarisation.

For the specific case, approximate expressions for the required grating parameters have been derived. These approximate expressions were found to agree well with the numerical calculations. Therefore the approximate expressions are valuable as a starting point for the optimization of the grating parameters towards minimum zero order transmission or maximum zero order reflection or a trade-off between those two. The approximate expressions are given by:

$$\frac{\Lambda}{\lambda} = \frac{2}{\sqrt{n_1^2 - 1}}$$

$$n_{0,\mathit{eff}} = \sqrt{n_1^2 - \left(\frac{\lambda}{\Lambda}\right)^2}$$

$$\frac{d}{\lambda} = \frac{3}{2(2n_{0,\mathit{eff}} - 1)}$$

$$f = 50\%$$

with:

$n_2=1$

Λ=grating pitch $n_{o,\mathit{eff}}$=effective index of the first propagating wave in the grating region.

d=grating depth f=grating filling factor

λ=vacuum wavelength

These expressions imply that the minimum value for $n_1$ in this specific case is $\sqrt{5}$.

In the following table we show some results for different cases. The filling factor f is chosen to be 50% in all cases. The optimum values $d_{opt}$ and $\Lambda_{opt}$ listed in this table are optimized through numerical calculations to obtain maximal reflectivity while the approximate values $d_{appr}$ and $\Lambda_{appr}$ are obtained by the express ions listed above.

| $n_1$ | $d_{opt}/\lambda$ | $\Lambda_{opt}/\lambda$ | $R_0^{TM}$ | $d_{appr}/\lambda$ | $\Lambda_{appr}/\lambda$ |
|---|---|---|---|---|---|
| 2.5 | 0.443 | 0.85 | 0.917718 | 0.436 | 0.873 |
| 3 | 0.360 | 0.670 | 0.966024 | 0.3495 | 0.707 |
| 3.5 | 0.300 | 0.570 | 0.999128 | 0.2916 | 0.596 |
| 4 | 0.263 | 0.550 | 0.952357 | 0.25 | 0.516 |

This table clearly shows the high zero order reflectivity that can be obtained and shows that the approximate expressions predict the optimum parameters quite accurately (typically within 5%). It also shows that the GIRO-effect works at its best for $n_1$ around 3.5 (for f=50%).

Preferred Embodiment 2

One potentially very important application for the GIRO-grating is its use as a mirror in a vertical cavity surface emitting laser (VCSEL), thereby replacing partly or wholly the normally used mirror being a Bragg quarter-wavelength stack. This can offer major advantages for the performance and fabrication simplicity of such devices.

In the sequel the invention is described for mirrors based on sub-wavelength gratings, with high reflectivity and polarization selectivity, called GIRO-grating. The operation principle and design are explained and illustrated together with their application in VCSELs. Mirrors based on these gratings would improve the thermal and electrical properties of these components and largely remove the polarization noise.

In the sequel, a novel solution is proposed to the problem of dielectric mirrors with high reflectivity. The approach adopted is based on the use of a rectangular, one-dimensional grating. It will be shown that these gratings can be designed such that they reflect more than 95% of the incident optical power in a wide variety of material systems. This solution could prove superior to the classical DBR-stack approach for the following reasons:

- In a number of material systems (e.g. InGaAsP), refractive index contrasts are low, and the DBR-solution becomes impractical because of the excessive number of DBR-periods required.
- The grating approach does not introduce additional materials, reducing the problems of differential thermal expansion and mechanical stability.
- The reflectivity is highly polarization selective, which is an important advantage in some applications.

One application with large potential currently envisaged for these GIRO-gratings is incorporation in VCSELs as the top mirror. One of the major difficulties in the current status of VCSEL fabrication, especially for long wavelength components, concerns the realization of high quality p-type VCSEL-mirrors, resulting from a difficult and fundamental trade-off between optical power absorption and mirror resistance. Current realizations, based on increasing doping levels at semiconductor hetero-interfaces in the mirrors, therefore exhibit high electrical resistance, leading to high VCSEL series resistance and thermal problems, and thereby to degraded VCSEL characteristics.

The following two sections focus on the design issues of the GIRO-gratings according to the present embodiment while the reflectivity characteristics of GIRO-grating designed for this application will be given in a still further section.

Figure 3A:
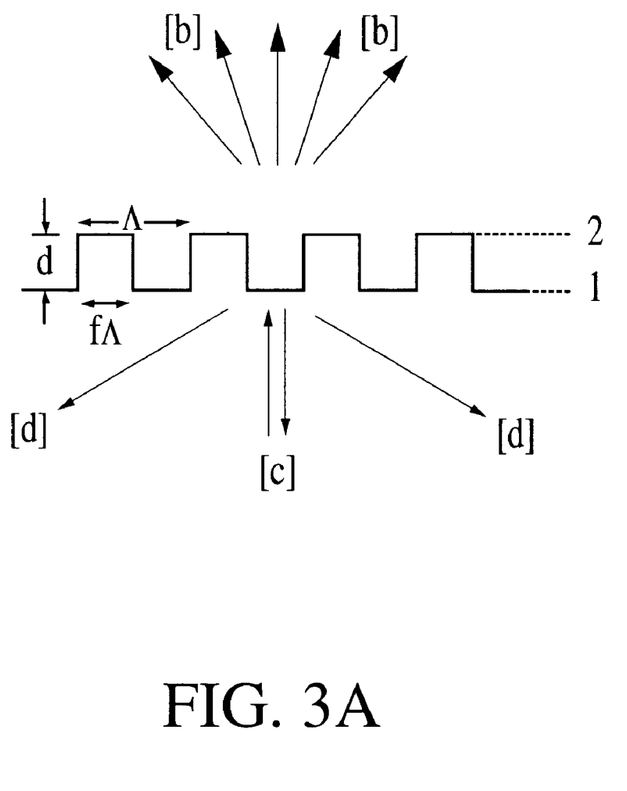
FIG. 3 shows a specific grating geometry and parameters according to the invention.
Figure 3B:
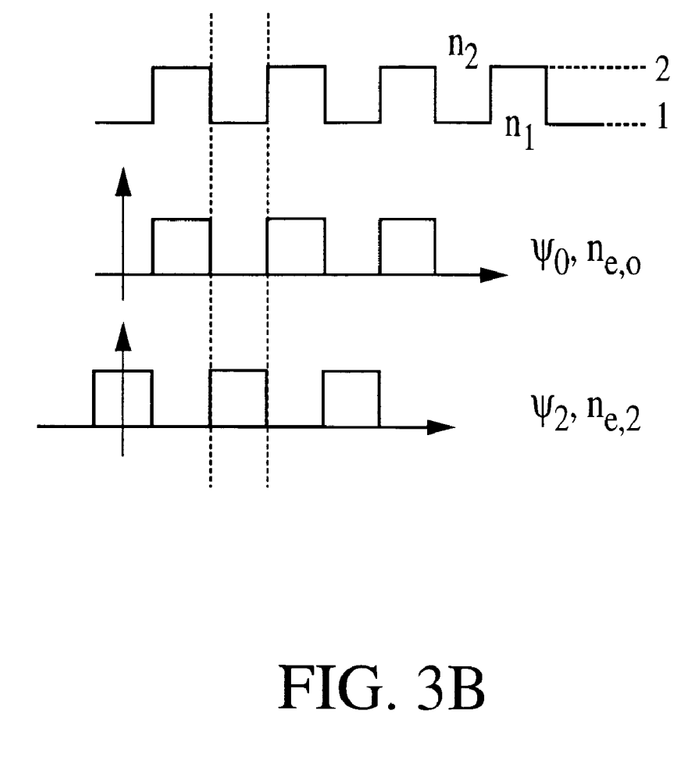

In this section, the working scheme of GIRO-gratings is set out, with geometry and notations shown in FIG. 3. A linearly polarized plane wave with free space wavelength $\lambda$ is incident on a grating with linear groves with period $\Lambda$, layer thickness d, and fill factor f, from a homogeneous medium with refractive index $n_1$. In general, due to diffraction in the grating layer, the incident optical power can couple to the following waves; zero order in transmission (a), higher orders in transmission (b), zero order in reflection (c) and higher orders in reflection (d). The question now is how to cancel all unwanted diffraction orders (all except (c)), thereby forcing all optical power to couple to the specular reflection, i.e. beam (c).

First of all, coupling to higher orders in transmission (b) is suppressed by the choice of grating period. The choice $\Lambda < \lambda/n_2$ assures that all but the zero orders in transmission are evanescent, and therefore carry no optical power ($n_2$ is the refractive index of the lossless transmission medium). Coupling to zero order in transmission is prevented, by assuring that the optical field has a zero average at interface 2, by adjusting the grating thickness such that the two present propagating modes are in anti-phase at this interface. Similarly, the grating parameters are chosen such that after reflection at interface 2, the backpropagating field interferes constructively with the primary reflection at interface 1, and the total reflected field exhibits a constant phase, thereby preventing coupling to uneven diffraction orders. This mechanism and the compromise to be taken in the GIRO-design is further clarified in the next section.

For given material parameters $n_1$ and $n_2$, the grating period is chosen such that only three propagation modes are supported in the grating regions, with respective field profiles $\psi_0(x)$, $\psi_1(x)$ and $\psi_2(x)$ and effective indices $n_{e,0}$, $n_{e,1}$ and $n_{e,3}$. Due to the uneven symmetry of mode 1, no optical power is coupled from the incident beam to this mode.

In order to arrive at relatively simple analytical design rules, the following approximations are made:

Modal profiles for zero and second order modes are approximated as shown in FIG. 3.

Reflection at interfaces is treated as a local phenomenon, i.e. at each point a local reflection coefficient r and transmission coefficient t is used. These coefficients are given by the Fresnel coefficients for reflection and transmission at plane interfaces for plane waves incidence.

Using these approximations, one can show that the total fields at interfaces 1 and 2 are given by $$\Psi_1(x) = r[\psi_2(x) + \psi_0(x)e^{-j2kn_{e,0}d}]$$

$$\Psi_2(x) = t[\psi_0(x)e^{-j2kn_{e,0}d} + \psi_0(x)e^{-j2kn_{e,2}d}]$$

with ($k=2\pi/\lambda$).

Expressing that the field $\psi_2$ has a zero average, leads immediately to $$f = 50\% \quad k(n_{e,0} - n_{e,2})d = (2m'+1)\pi$$

while the condition that coupling of the field $\psi_1$ to zero order in reflection is maximized gives $$2kn_{e,0}d = m2\pi.$$

In the following discussion, we will set m'=0 and m=2.

Given the fact that for proper operation of the GIRO-grating, the zero order mode should be concentrated in the grating material $n_1$, and therefore strongly guided, with $n_{e,0} \gg n_1$ and the second order mode should be concentrated in the material with refractive index $n_2$, following approximations can be found:

$$n_{e,0} = \sqrt{n_1^2 - (\lambda/\Lambda)^2}$$

$$n_{e,2} = n_2 \text{ and } \Lambda = \frac{2\lambda}{\sqrt{n_1^2 - n_2^2}}$$

With these values for the effective indices of the propagating modes, the system of equations is over specified, and is only solvable if $n_1 = \sqrt{5}\, n_2$, in which case $\Lambda = \lambda/n_2$. Consequently in order at arrive to meaningful designs in other situations, an additional degree of freedom should be introduced, relaxing the strict conditions imposed on destructive (1) and constructive (2) interference.

Allowing a phase error $\phi$ between the modes arriving at interface 2, and consequently a 2$\phi$ phase error at interface 1, we arrive at the following set of design rules, applicable to any combinations of $n_1$ and $n_2$:

$$f = 50\%$$

$$\frac{d}{\lambda} = \frac{3/2}{\sqrt{3n_1^2 + n_2^2} - n_2}$$

$$\frac{\Lambda}{\lambda} = \frac{2}{\sqrt{n_1^2 - n_2^2}}$$

In view of the approximations used to arrive at the design rules given in the previous section, designs based on this approach are evaluated in this section directed on a comparison with rigorous modelling. A rigorous diffraction model based on RCWA (Rigorous Coupled Wave Analysis) was used to predict the coupling of optical power to zero order in reflection for TM-polarization, i.e. electrical fields perpendicular to grating grooves. Here a semiconductor-air grating was modeled ($n_2$=1) with a filling factor of 50%. For a number of substrate materials, optimum values for d/$\lambda$ and $\Lambda/\lambda$ were derived using iteration through the RCWA based model, using the design rules as a starting based model, using the design rules as a starting configuration.

RCWA results are given in table 1 wherein the subscript "appr" refers to the start values and optimum values are indicated with the subscript "opt". The fraction of the incident optical power coupled to the desired zero order in reflection is given for the optimum parameter set. Table 1 shows a comparison of GIRO-grating design based on expressions presented herein and optimization based on RCWA.

From table 1*, one can conclude that the optimum parameter set for the GIRO-grating is quite well predicted by the design rules, and that indeed reflection values exceed 90%. For the particularly interesting case of $n_1$=3.5 which is close to the refractive index in GaAs for the 1 $\mu$m wavelength range but also to the refractive index of InGaAsP for long wavelength applications, this reflection even exceeds 99.5%.

TABLE 1

| $n_1$ | (d/$\lambda$)$_{appr}$ | ($\Lambda/\lambda$)$_{appr}$ | (d/$\lambda$)$_{opt}$ | ($\Lambda/\lambda$)$_{opt}$ | $R_0^{TM}$ |
|---|---|---|---|---|---|
| 2.5 | 0.4360 | 0.873 | 0.443 | 0.850 | 0.9177 |
| 3.0 | 0.3495 | 0.707 | 0.360 | 0.670 | 0.9660 |
| 3.5 | 0.2916 | 0.596 | 0.300 | 0.570 | 0.9991 |
| 4.0 | 0.2500 | 0.516 | 0.263 | 0.550 | 0.9524 |

In this section an example is given. As already mentioned in the introductory part above, an important application of the GIRO-gratings could be the use of these diffractive structures as VCSEL-top mirror.

Especially for long wavelength VCSELs, due to the low refractive index contrast available in the InGaAsP material system, this approach seems quite attractive. Based on the design rules given in a previous section, a GIRO-grating has been designed for high reflectivity centered at $\lambda$=1.55 $\mu$m. The grating layer itself consists of a 50% grating etched into a quaternary layer ($\lambda$g=1.3 $\mu$m, n=3.49) and the substrate material is InP (n=3.176). Parameters of the optimized GIRO-grating are: grating period 930 nm, grating depth 465 nm and grating fill factor 50%.

Figure 4:
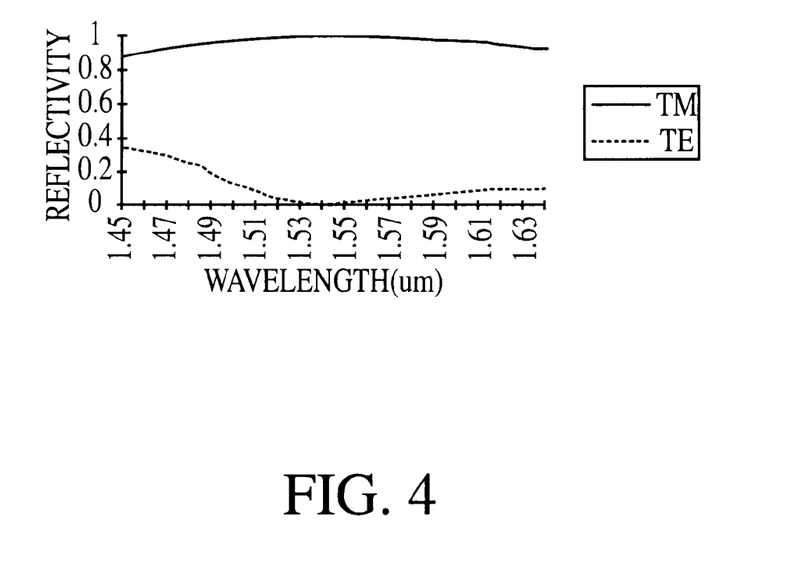
FIG. 4 shows a graph for a 0 order reflectivity of said specific grating designed for high reflectivity.

Reflectivity for the TM and TE zero orders are shown in FIG. 4 with results obtained by RCWA modelling. The TM-reflectivity amounts to 99,9% while the TE-reflectivity is as low as 2.0%. This indicates that the use of GIRO-gratings also may offer a possibility to solve the VCSEL-problem of polarization instability.

Hereinafter, there is described the fabrication and experimental evaluation of GIRO-gratings, designed for operation at a wavelength of 10.6 $\mu$m, which is the wavelength range of $CO_2$-lasers.

The results discussed here relate to the first experimental realization of GIRO-gratings.

Figure 5:
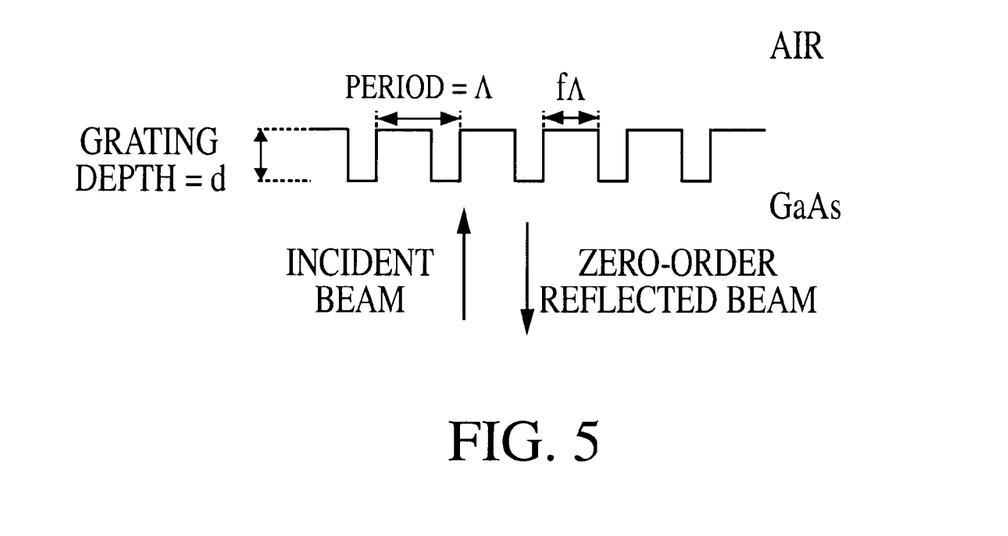
FIG. 5 shows a specific so-called GIRO-geometry chosen for fabrication.

The so-called GIRO structure for operation at a wavelength of 10.6 $\mu$m is set out hereafter. In view of the relatively easy fabrication geometry as depicted in FIG. 5 was adopted to realize GIRO-gratings for $\lambda$=10.6 $\|$m. The component consists of a linear grating, with rectangular grooves, etched into a GaAs substrate. The geometry is designed such that the zero-order reflectivity for on-axis incidence is maximized for a TM-polarized plane wave whereby TM-polarization means incident electrical field vector perpendicular to the grating grooves. This plane wave is incident from the substrate side, and is consequently reflected back into the substrate.

Based on the design rules described in (REF) and taken into account the geometry depicted in FIG. 5, GIRO-gratings were optimized, resulting in the optimum parameter set given in Table 1*. Grating filling factor (f) is defined as the percentage of grating material in one grating period.

TABLE 1

Optimum parameter set for GIRO-grating (geometry shown in FIG. 5)

| Parameter | Value |
|---|---|
| wavelength of Operation ($\lambda$) | 10.6 $\mu$m |
| substrate material: GaAs | retractive index = 3.27 at $\lambda$ = 10.6 $\mu$m |
| grating period ($\Lambda$) | 7 $\mu$m |
| grating filling factor (f) | 3/7 |
| grating depth (d) | 3.5 $\mu$m |
| maximum TM-reflectivity | 99.8% |

In view of the technology used to realize these GIRO-gratings, some of these parameters were changed to simplify the production of these components and hence increase the component yield. Taking into account these technological limitations mainly due to the optical contact lithography used, we arrived at four grating designs with parameters given in Table 2, compatible with the fabrication method used.

TABLE 2

Parameters of the realised GIRO-gratings (wavelength of operation is 10.6 μm, substrate material is GaAs).

| PARAMETER | GIRO 1 | GIRO 2 | GIRO 3 | GIRO 4 |
|---|---|---|---|---|
| grating period (Λ) | 6 μm | 6 μm | 7 μm | 8 μm |
| grating filling factor (f) | 2/6 | 3/6 | 3/7 | 3/8 |
| grating depth (d) | 3.5 μm | 3.5 μm | 3.5 μm | 3.5 μm |
| Maximum TM-reflectivity (theoretical) | 99.4% | 98.7% | 99.8% | 99.1% |

Hereafter there is described more in detail a GIRO-grating fabrication process in a specific example:

substrate material

The GIRO-gratings are realised in GaAs. In order to avoid substrate absorption, e.g. through free carrier absorption, undoped material is used. Prior to further processing, the substrates are cleaned to ensure reproducible and reliable component realization.

Deposition of $SiO_2$

A layer of 200 nm $SiO_2$ is deposited, e.g. by plasma deposition. This layer serves as mask during the semiconductor etching process. The processing steps are summarized below.

Application of photoresist layer pattern definition in photoresist

Photoresist is UV-illuminated through a mask plate (Chromium features on glass) using contact lithography. Developing this photoresist layer transfers the pattern of the mask into the photoresist layer.

pattern definition in the $SiO_2$-layer

Since the photoresist layer can not withstand the semiconductor etching process, an intermediate mask level is used. The photoresist pattern is transferred into a $SiO_2$-layer by plasma etching.

pattern definition in the GaAs substrate

Using the combined photoresist and $SiO_2$ mask, the GaAs material is etched (the process used in Reactive Ion Etching with $SiCl_4$).

stripping of residues (a.o. photoresist and $SiO_2$)

By applying an oxygen plasma etch, unwanted etching residues are removed.

The experimental evaluation methodology is set out hereafter.

Figure 6:
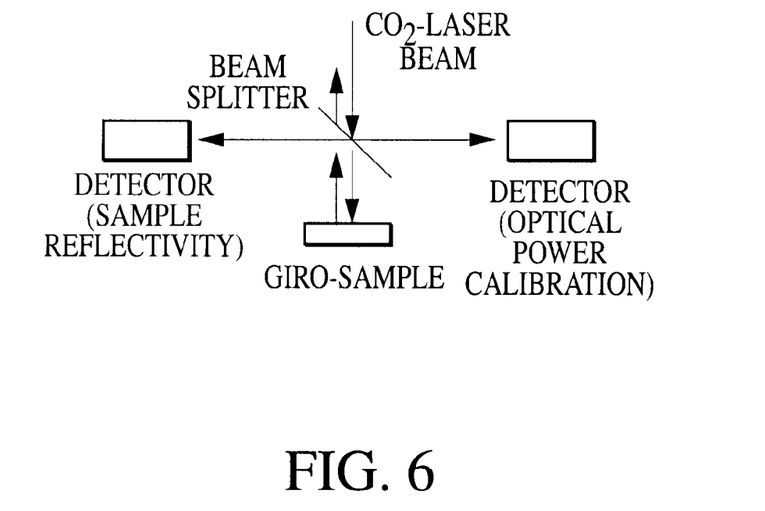
FIG. 6 is a schematic drawing of the measurement set-up used in a specific application of the grating according to the invention.

For the experimental evaluation of the realized structures, a set-up as schematically shown in FIG. 6 was used. A $CO_2$-laser beam is incident upon a beam splitter. Part of the optical power is coupled directly to a detector for calibration purposes, and the other part is coupled to another detector after reflection on the sample.

Figure 7:
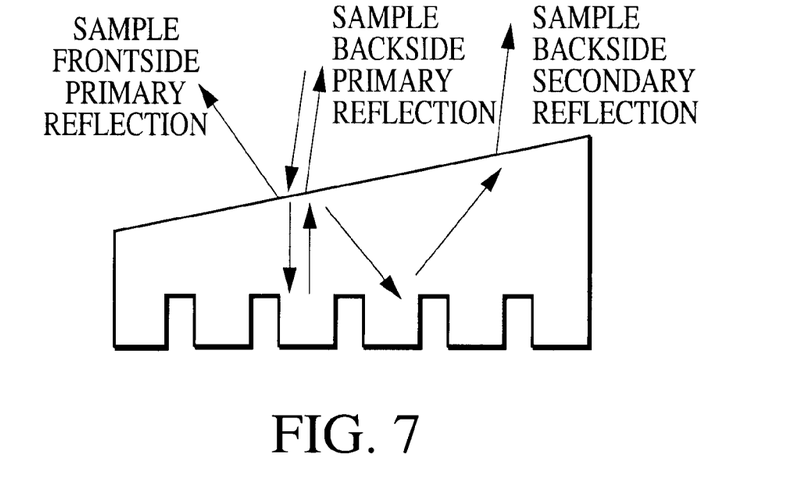
FIG. 7 shows an angle-polishing graph of the specific grating samples to avoid interference through multiple reflections.

In order to facilitate the measurements, the backside of the samples are angle-polished, e.g. with a typical polishing angle of 3.5°. This approach allow separate measurement of frontside and backside sample reflectivity, while avoiding interference through multiple reflections inside the GIRO-sample, which would severely complicate the measurement interpretation (FIG. 7). Measuring the optical power in the front- and backside primary reflected beams, in combination with monitoring the incident optival power, allows the derivation of the GIRO-grating reflectivity in absolute terms.

What is claimed is:

1. A system for transferring a beam of electromagnetic radiation having a vacuum wavelength, said system comprising:
   a first dielectric medium with a first refractive index $n_1$ wherein said beam can propagate;
   a second dielectric medium with a second refractive index $n_2$; and
   a dielectric region in between said first and said second medium, characterized in that said region has a periodicity of the dielectric properties parallel to said region, said periodicity having a period that is smaller than the wavelength of the electromagnetic radiation in said second dielectric medium, said dielectric properties and said periodicity of said dielectric region further being chosen such that the average refractive index of said dielectric region is not greater than said first refractive index $n_1$ and not less than said second refractive index $n_2$ and that the dielectric region establishes that said beam when incident on said dielectric region is reflected more than 90% into the specular zero-order reflection, said dielectric region further characterized in that said region has a sufficiently large variation of said dielectric properties within one repetition of said period such that said beam when incident on said dielectric region excites at least two modes propagating within said dielectric region along a direction normal thereto, and wherein at least one of the propagating modes is of higher order.

2. A system as recited in claim 1, characterized in that the at least two propagating modes within said dielectric region are perpendicular to said dielectric region.

3. A system as recited in claim 2, wherein said beam is substantially orthogonal incident on said dielectric region.

4. A system as recited in claim 1, wherein said dielectric region has a periodicity of the dielectric properties in a plurality of directions, said periodicity having a period for each of said directions that is smaller than the wavelength of the electromagnetic radiation in said second dielectric medium.

5. A system as recited in claim 1, wherein said dielectric region is a grating.

6. A system according to claim 5, wherein said grating is a grated surface structure of the second dielectric medium, said dielectric region being composed of the same material as said second medium.

7. A system according to claim 5, wherein said grating has a one dimensional periodicity (Λ).

8. A system according to claim 5, characterized in that the incident beam is TM-polarized.

9. A system according to claim 5, characterized in that the incident beam is TE-polarized.

10. A system according to claim 9, wherein said grating has a substantially rectangular cross section.

11. A system according to claim 5, wherein said grating has a grating filling factor (f) which is comprised between 40 and 60%.

12. A system according to claim 5, wherein the second medium referred to the propagating direction of said beam is formed by air or vacuum with a second refractive index $n_2$ approximately equal to unity.

13. A system according to claim 5, wherein the arrangement thereof is such that the angle of incidence of the incident beam is substantially normal to the grating.

14. A system according to claim 1, wherein the first refractive index $n_1$ is chosen so as to be comprised within a range between 3 and 4.

15. A system according to claim 1, characterized in that said refractive index $n_1$ and said refractive index $n_2$ are complex numbers with substantially small imaginary parts.

16. A system according to claim 1, wherein said dielectric region is used as a mirror.

17. A system according to claim 16, wherein said mirror comprises a highly reflective, substantially rectangular, one-dimensional grating.

18. A system according to claim 17, wherein said grating is provided with substantially linear grooves from a homogeneous medium with refractive index $n_1$ and wherein the selection of the grating period is such that coupling to higher orders in transmission is suppressed, wherein the at least two propagating modes includes two forward propagating modes and two back propagating modes, wherein the grating thickness is selected such that the two forward propagating modes within said dielectric region and perpendicular to said dielectric region are, after propagation through the grating, in anti-phase, the two back propagating modes interfering constructively with the primary reflection, and the total reflected field exhibiting a constant phase.

19. A system as recited in claim 18, wherein said dielectric region is one of the mirrors in a laser cavity, said electromagnetic radiation being visible light.

20. A system as recited in claim 18, wherein said dielectric region is one of the mirrors in a laser cavity, said electromagnetic radiation being infrared light.

21. A system as recited in claim 18, wherein said dielectric region is one of the mirrors in a laser cavity, said electromagnetic radiation being ultraviolet light.

22. A system as recited in claim 21, wherein said laser is a vertical cavity surface emitting laser (VCSEL).

23. A system for transferring a beam of electromagnetic radiation having a vacuum wavelength, said system comprising:
a first dielectric medium with a first refractive index $n_1$ wherein said beam can propagate;
a second dielectric medium with a second refractive index $n_2$; and
a dielectric region in between said first and said second medium, characterized in that said region is a grating having a periodicity of the dielectric properties parallel to said region, said periodicity having a period that is smaller than the wavelength of the electromagnetic radiation in said second dielectric medium, said dielectric properties and said periodicity of said dielectric region further being chosen such that the average refractive index of said dielectric region is not greater than said first refractive index $n_1$ and not less than said second refractive index $n_2$ and that the dielectric region establishes that said beam when incident on said dielectric region is reflected for essentially 100% into the specular zero-order reflection, said dielectric region further characterized in that said region has a sufficiently large variation of said dielectric properties within one repetition of said period such that said beam when incident on said dielectric region excites at least two modes propagating within said dielectric region along a direction normal thereto, wherein the arrangement thereof is such that the angle of incidence of the incident beam is substantially normal to the grating and further characterized in that the grating parameters are chosen so that the reflection and transmission behavior of said system provides minimized zero order transmission in conjunction with maximized zero order reflection and wherein said grating parameters are generated by the following expressions $$\frac{\Lambda}{\lambda} = \frac{2}{\sqrt{n_1^2 - 1}}$$

$$n_{0,\mathit{eff}} = \sqrt{n_1^2 - \left(\frac{\lambda}{\Lambda}\right)^2}$$

$$\frac{d}{\lambda} = \frac{3}{2(2n_{0,\mathit{eff}} - 1)}$$

$$f = 50\%$$

wherein
$n_{0,\mathit{eff}}$=effective index of a first propagating mode in the grating region,
$\lambda$=vacuum wavelength,
$\Lambda$=grating periodicity,
f=a grating filling factor,
d=grating depth.

24. A system for transferring a beam of electromagnetic radiation having a vacuum wavelength, said system consisting essentially of:
a first dielectric medium with a first refractive index no wherein said beam can only propagate in said first dielectric medium;
a second dielectric medium with a second refractive index $n_2$; and
a dielectric region in between said first and said second medium, characterized in that said region has a periodicity of the dielectric properties parallel to said region, said periodicity having a period that is smaller than the wavelength of the electromagnetic radiation in said second dielectric medium, said dielectric properties and said periodicity of said dielectric region further being chosen such that the average refractive index of said dielectric region is not greater than said first refractive index $n_1$ and not less than said second refractive index $n_2$ and that their refractive index values cooperatively establish that said beam when incident on said dielectric region is reflected more than 90% into the specular zero-order reflection.

25. A system as recited in claim 24, characterized in that said dielectric region has a sufficiently large variation of said dielectric properties within one repetition of said period such that said beam when incident on said dielectric region exciter at least two propagating modes within said dielectric region and perpendicular to said dielectric region and wherein at least one of the propagating modes is of higher order.

26. A system as recited in claim 25 wherein said beam is substantially orthogonal incident on said dielectric region.

27. A system as recited in claim 24 wherein said dielectric region has a periodicity of the dielectric properties in a plurality of directions, said periodicity having a period for each of said directions that is smaller than the wavelength of the electromagnetic radiation is said second dielectric medium.

28. A system as recited in claim 24, wherein said dielectric region is a grating.

29. A system according to claim 28, wherein said grating is a grated surface structure of the second dielectric medium, said dielectric region being composed of the same material as said second medium.

30. A system according to claim 28, wherein said grating has a one dimensional periodicity (Λ).

31. A system according to claim 28, characterized in that the incident beam is TM-polarized.

32. A system according to claim 28, characterized in that the incident beam is TE-polarized.

33. A system according to claim 32, wherein said grating has a substantially rectangular cross section.

34. A system according to claim 28, wherein said grating has a grating filling factor (f) which is comprised between 40 and 60%.

35. A system according to claim 28, wherein the second medium referred to the propagating direction of said beam is formed by air or vacuum with a second refractive index $n_2$ approximately equal to unity.

36. A system according to claim 28, wherein the arrangement thereof is such that the angle of incidence of the incident beam is substantially normal to the grating.

37. A system according to claim 36, characterized in that the grating parameters are chosen so that the reflection and transmission behavior of said system provides minimized zero order transmission in conjunction with maximized zero order reflection and wherein said grating parameters are generated by the following expressions $$\frac{\Lambda}{\lambda} = \frac{2}{\sqrt{n_1^2 - 1}}$$

$$n_{0,eff} = \sqrt{n_1^2 - \left(\frac{\lambda}{\Lambda}\right)^2}$$

$$\frac{d}{\lambda} = \frac{3}{2(2n_{0,eff} - 1)}$$

$$f = 50\%$$

wherein $n_{0,eff}$=effective index of a propagating mode in the grating region, λ=vacuum wavelength, Λ=grating periodicity, f=a grating filling factor, d=grating depth.

38. A system according to claim 24, wherein the first refractive index $n_1$ is chosen so as to be comprised within a range between 3 and 4.

39. A system according to claim 24, characterized in that said refractive index $n_1$ and said refractive index $n_2$ are complex numbers with substantially small imaginary parts.

40. A system according to claim 24 wherein said dielectric region is used as a mirror.

41. A system according to claim 40, wherein said mirror comprises a highly reflective, substantially rectangular, one-dimensional grating.

42. A system according to claim 41, wherein said grating is provided with substantially linear grooves from a homogeneous medium with refractive index $n_1$ and wherein the selection of the grating period is such that coupling to higher orders in transmission is suppressed, wherein the at least two propagating modes includes two forward propagating modes and two back propagating modes, wherein the grating thickness is selected such that the two forward propagating modes within said dielectric region and perpendicular to said dielectric region are, after propagation through the grating, in anti-phase, the two back propagating modes interfering constructively with the primary reflection, and the total reflected field exhibiting a constant phase.

43. A system as recited in claim 42, wherein said dielectric region is one of the mirrors in a laser cavity, said electromagnetic radiation being visible light.

44. A system as recited in claim 42, wherein said dielectric region is one of the mirrors in a laser cavity, said electromagnetic radiation being infrared light.

45. A system as recited in claim 42, wherein said dielectric region is one of the mirrors in a laser cavity, said electromagnetic radiation being ultraviolet light.

46. A system as recited in claim 42, wherein said grating defines a first interface and a second interface wherein said two backward propagating modes are interfering constructively at said first interface and said two forward propagating modes are in anti-phase at said second interface.

47. A system as recited in claim 24, wherein the beam propagating in the first dielectric medium includes at least one higher order mode.

48. A system for transferring a beam of electromagnetic radiation having a vacuum wavelength, said system consisting essentially of:

a first dielectric medium with a first refractive index $n_1$ wherein said beam can propagate;

a second dielectric medium with a second refractive index $n_2$; and a dielectric region in between said first and said second medium, characterized in that said region has a periodicity of the dielectric properties parallel to said region, said periodicity having a period that is smaller than the wavelength of the electromagnetic radiation in said second dielectric medium, said dielectric properties and said periodicity of said dielectric region further being chosen such that the average refractive index of said dielectric region is not greater than said first refractive index $n_1$ and not less than said second refractive index $n_2$ and that their refractive index values cooperatively establish that said beam when perpendicularly incident to said dielectric region is reflected more than 90% into the specular zero-order reflection, wherein said dielectric region has a sufficiently large variation of said dielectric properties within one repetition of said period such that said beam when incident on said dielectric region excites at least two higher order modes propagating within said dielectric region along and incident path.

49. A system as recited in claim 46, wherein the beam can only propagate in the first dielectric medium.

* * * * *